United States Patent
Sonobe et al.

(10) Patent No.: US 8,093,606 B2
(45) Date of Patent: Jan. 10, 2012

(54) NITRIDE SEMICONDUCTOR LIGHT EMITTING DEVICE

(75) Inventors: Masayuki Sonobe, Kyoto (JP); Norikazu Ito, Kyoto (JP); Mitsuhiko Sakai, Kyoto (JP)

(73) Assignee: Rohm Co., Ltd., Kyoto-Shi (JP)

(*) Notice: Subject to any disclaimer, the term of this patent is extended or adjusted under 35 U.S.C. 154(b) by 694 days.

(21) Appl. No.: 12/085,564

(22) PCT Filed: Nov. 28, 2006

(86) PCT No.: PCT/JP2006/323681
§ 371 (c)(1),
(2), (4) Date: May 28, 2008

(87) PCT Pub. No.: WO2007/063833
PCT Pub. Date: Jun. 7, 2007

(65) Prior Publication Data
US 2009/0278144 A1    Nov. 12, 2009

(30) Foreign Application Priority Data
Nov. 29, 2005    (JP) ................. 2005-344168

(51) Int. Cl.
*H01L 33/00* (2010.01)
(52) U.S. Cl. ..... 257/98; 257/94; 257/103; 257/E33.013; 257/E33.023; 257/E33.025; 257/E33.028; 257/E33.03; 257/E33.033; 257/E33.034; 257/E33.067; 257/E33.069
(58) Field of Classification Search .......... 257/98, 257/E33.067, E33.069, 94, 103, E33.013, 257/E33.023, E33.025, E33.028, E33.03, 257/E33.033, E33.034
See application file for complete search history.

(56) References Cited

U.S. PATENT DOCUMENTS

| | | | |
|---|---|---|---|
| 5,874,747 A * | 2/1999 | Redwing et al. | 257/77 |
| 6,597,017 B1 | 7/2003 | Seko et al. | |
| 2003/0047744 A1 * | 3/2003 | Yanamoto | 257/98 |

FOREIGN PATENT DOCUMENTS

| | | |
|---|---|---|
| JP | 64-032690 | 2/1989 |
| JP | 08-139414 | 5/1996 |
| JP | 08-228048 | 9/1996 |
| JP | 2002-185043 | 6/2002 |
| JP | 2003-107241 | 4/2003 |

* cited by examiner

Primary Examiner — Jay C Kim
(74) Attorney, Agent, or Firm — Rabin & Berdo, PC

(57) ABSTRACT

There is provided a nitride semiconductor light emitting device having a light reflection layer capable of preventing reflectivity from lowering and luminance from lowering due to deterioration of quality of an active layer. A nitride semiconductor laser includes at least a light emitting layer forming portion (3) provided on a first light reflection layer (2) provided on a substrate (1). The first light reflection layer (2) is formed with laminating a low refractivity layer (21) and a high refractivity layer (22) which have a different refractivity from each other, and the low refractivity layer (21) of the first light reflection layer is formed with a single layer structure of an $Al_xGa_{1-x}N$ layer ($0 \leqq x \leqq 1$), and the high refractivity layer (22) of the first light reflection layer is formed with a multi layer structure formed by laminating alternately an $Al_yGa_{1-y}N$ layer ($0 \leqq y \leqq 0.5$ and $y<x$) or an $In_tGa_{1-t}N$ layer ($0<t \leqq 0.5$) and an $In_uGa_{1-u}N$ layer ($0<u \leqq 1$ and $t<u$).

8 Claims, 3 Drawing Sheets

NITRIDE SEMICONDUCTOR LIGHT EMITTING DEVICE

FIELD OF THE INVENTION

The present invention relates to a nitride semiconductor light emitting device, in which a light reflection layer is formed at least at a substrate side of a light emitting layer forming portion, such as a resonant cavity light emitting diode or the like in which light emitted with high efficiency by a resonant cavity formed by forming light reflection layers on both of upper and lower surfaces of the light emitting layer forming portion is taken out from a surface side.

BACKGROUND OF THE INVENTION

In recent years, nitride semiconductor light emitting devices having a distributed Bragg reflector (hereinafter, referred to as DBR) which can selectively reflect light injected into a multi-layered film formed by laminating two layers having different refractivity alternately have been developed. Generally, the DBR is a reflector formed by laminating layers having a high refractivity and a low refractivity alternately and having a thickness of $\lambda/(4n)$, wherein a wavelength of an aimed light in vacuum (air) is $\lambda$ and a refractive index of a material is n. By this structure, in the light of a wavelength $\lambda$, there become in the same phase a wave which is reflected at a boarder between the high refractivity layer and the low refractivity layer when the incident light travels from the layer having a high refractivity to the layer having a low refractivity and a wave which is reflected at a boarder between the low refractivity layer and the high refractivity layer when the incident light travels from the layer having a low refractivity to the layer having a high refractivity, thereby a high reflectivity can be obtained. The reflectivity can be high with relatively small number of layers in case of laminating alternately two layers in which difference of refractivity is sufficiently large.

A laser device using nitride semiconductor as an example of a semiconductor light emitting device using the DBR is realized, as shown in FIG. 3, by forming, on a substrate 1, a buffer layer 9, an n-GaN contact layer 10, an n-type first light reflection layer 2, a light emitting layer forming portion 3 made with an active layer 32 sandwiched by an n- and p-GaN spacer layers 31 and 32, a p-type second light reflection layer 4, and a p-GaN contact layer 5, and providing a p-side electrode 8 on the p-GaN contact layer 5, and an n-side electrode 7 on an exposed portion of the n-GaN contact layer 10. The n-type first light reflection layer 2 and the p-type second light reflection layer 4 are formed by laminating a low refractivity layer 21 made of an n-AlGaN based compound (which means a compound in which a mixed crystal ratio of Al and Ga is not unequivocal and can be varied variously, and 'based', below means the same hereinafter) with a single layer structure and a high refractivity layer 22 made of an n-InGaN based compound with a single layer structure, respectively with a thickness of $\lambda/(4n)$ ($\lambda$ is a wavelength and n is a refractive index) and alternately (cf. PATENT DOCUMENT 1).
PATENT DOCUMENT 1: Japanese Patent Application Laid-Open No. H8-228048 (FIG. 3)

DISCLOSURE OF THE INVENTION

Problem to be Solved by the Present Invention

If a semiconductor light emitting device having a light reflection layer structure above and under an active layer is formed, light traveling upward and downward is radiated by repeating the reflection at the light reflection layer. However, in the above-described device, since lattice constants and coefficients of thermal expansion of an AlGaN based compound layer constituting a low refractivity layer and an InGaN based compound layer constituting a high refractivity layer are largely different, a strain is generated in the light reflection layer, and deteriorates crystallinity of the light reflection layer, therefore a coefficient of reflection can not be enhanced so high as a theoretical value. Then, the present inventors suggested that the low refractivity layer is formed with a multi layer structure of AlGaN based compound layers and GaN layers of thin films. By this constitution, since the strain in the light reflection layer can be relaxed and hardly occurs, reflectivity can be prevented from lowering.

However, when making a device in which the low refractivity layer of the light reflection layer is formed with a multi layer structure by laminating an AlGaN based compound layer and a GaN layer alternately, the reflectivity can be surely improved but there arises a problem of lowering of quality of the active layer and luminance.

Then, the present invention is directed to solve the above-described problem and an object of the present invention is to provide a nitride semiconductor light emitting device having a light reflection layer capable of preventing reflectivity from lowering and luminance from lowering due to deterioration of quality of the active layer.

Means for Solving the Problem

As a result of earnest studies and examinations of a cause why the quality of the active layer deteriorates, the present inventors found that the cause of deterioration of the quality of the active layer is deterioration of flatness of a first light reflection layer provided between the substrate and the active layer. And, as a result of more detailed studies, it was found that, since the low refractivity layer is formed with a multi layer structure of a GaN layer and an AlGaN based compound layer, the cause is originated in a thickness of the AlGaN based compound layer which is formed thinner than that in a conventional single layer. Namely, if the low refractivity layer of the first light reflection layer is formed by a multi layer structure, since the low refractivity layer is provided with the GaN layer besides the AlGaN based compound layer, total thickness of the AlGaN based compound layers in the low refractivity layer becomes thinner than that in a conventional single layer. Then, it has been suggested that a thin thickness of the AlGaN based compound layer in the low refractivity layer lowers an effect of inhibiting a defect called a V defect occurring in a high refractivity layer made of an InGaN based compound layer. Now, the V defect means a defect with a V shape which occurs when an InGaN based compound layer is laminated in a semiconductor light emitting device and obstructs flatness of the InGaN based compound layer. If the defect occurs, the flatness of a surface of the InGaN based compound layer is obstructed, the flatness of layers laminated on the InGaN based compound layer is also loosed and crystallinity thereof is deteriorated.

Namely, the present inventor found that, if a low refractivity layer by an inventive idea of the present inventor is formed with a multi layer structure of an AlGaN based compound layer and a GaN layer as described above, the low refractivity layer formed by laminating the AlGaN based compound layer and the GaN layer alternately is formed on the high refractivity layer made of an InGaN based compound layer, a total thickness of the AlGaN based compound layer composing the low refractivity layer becomes thinner than that of the AlGaN based compound layer with a conventional single structure, and an effect of absorbing the V defect occurring in the InGaN based compound layer of the high refractivity layer is decreased, thereby quality of the active layer lowers.

The nitride semiconductor light emitting device according to the present invention includes: a substrate; a light reflection layer provided on the substrate, the light reflection layer being formed by laminating alternately a low refractivity layer and a high refractivity layer which has a higher refractivity than that of the low refractivity layer; and a light emitting layer forming portion provided on the light reflection layer, wherein the low refractivity layer of the light reflection layer is formed with a single layer structure of an $Al_xGa_{1-x}N$ (0<x<1) layer, and the high refractivity layer of the light reflection layer is formed with a multi layer structure formed by laminating alternately an $Al_yGa_{1-y}N$ (0≦y≦0.5 and y<x) layer or an $In_tGa_{1-t}N$ (0<t≦0.5) layer and an $In_uGa_{1-u}N$ (0<u≦1 and t<u) layer.

In addition, it is preferable that the high refractivity layer of the light reflection layer is formed with a multi layer structure formed by laminating alternately an $Al_yGa_{1-y}N$ (0≦y≦0.5 and y<x) layer and an $In_uGa_{1-u}N$ (0<u≦1) layer.

Further, it is preferable that a second light reflection layer formed by laminating alternately a low refractivity layer and a high refractivity layer which has a higher refractivity than that of the low refractivity layer is further provided at an upper surface side of the light emitting layer forming portion, and both of the low refractivity layer and the high refractivity layer of the second light reflection layer are formed with a multi layer structure, from the view point of improving a reflectivity of the second light reflection layer.

Effect of the Invention

According to the present invention, in the low refractivity layer of the light reflection layer provided between the substrate and the active layer, an AlGaN based compound layer is employed, the AlGaN low refractivity layer absorbs and flattens V defects occurring in the high refractivity layer including an InGaN based compound layer, and the active layer laminated on the light reflection layer is also flattened, thereby crystallinity of the active layer is not deteriorated. On the other hand, since the high refractivity layer is formed with a multi layer structure including the InGaN based compound layer, comparing to a conventional structure, strain of the light reflection layer can be relaxed, the strain becomes not to occur, and lowering of reflection coefficient can be inhibited.

In addition, by forming the high refractivity layer with a multi layer structure of laminating an $Al_zGa_{1-z}N$ layer (0≦z≦0.5 and z<x) and an $In_uGa_{1-u}N$ (0<u≦1) layer alternately, a thickness of the InGaN based compound layer in the high refractivity layer becomes thin comparing to that in a conventional case of an InGaN based compound layer of a single layer structure without using the multi layer structure. Therefore, deterioration of flatness caused by the V defects can be inhibited comparing to a conventional structure. Then, a semiconductor light emitting device, in which the deterioration of the flatness caused by the V defects is perfectly inhibited, and the deterioration of crystallinity caused by difference of lattice constants and coefficients of thermal expansion is inhibited, can be obtained.

EXPLANATION OF LETTERS AND NUMERALS

Figure 1:
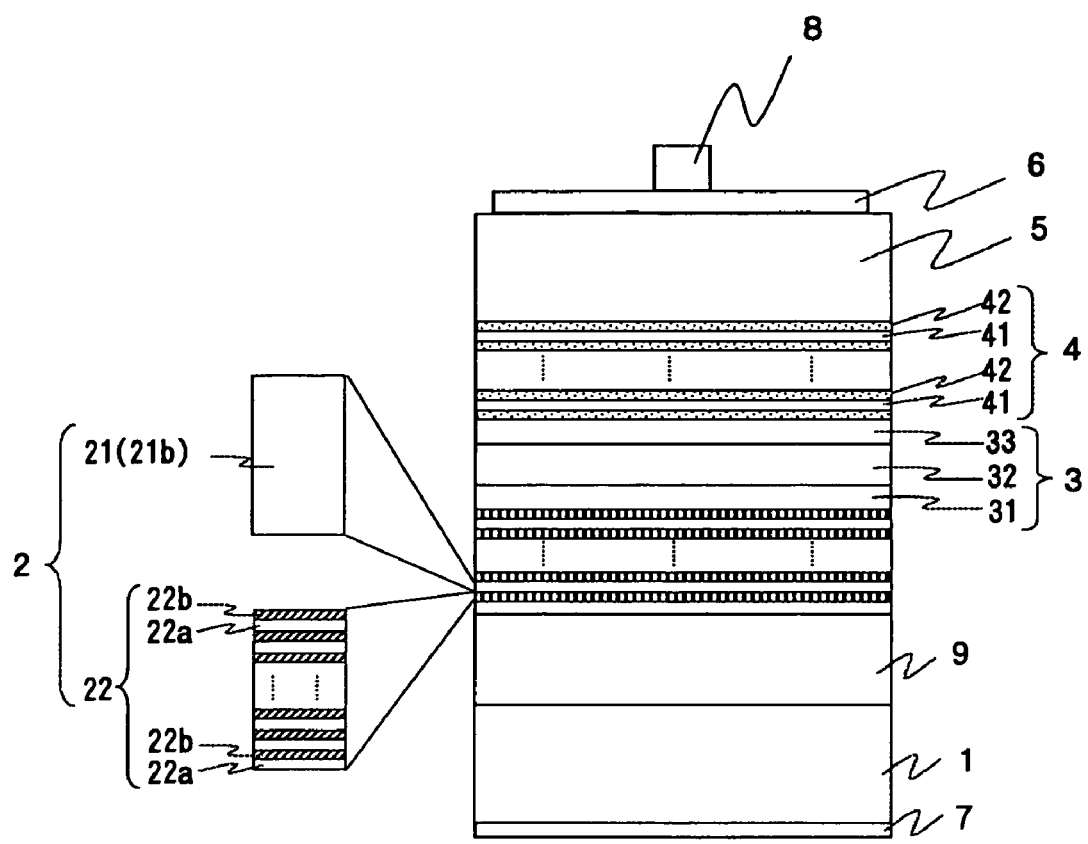
FIG. 1 is an explanatory cross-sectional view of a semiconductor laser which is an embodiment of the present invention.

1: substrate
2: first light reflection layer
3: light emitting layer forming portion
4: second light reflection layer
21: low refractivity layer of the first light reflection layer
22: high refractivity layer of the first light reflection layer

THE BEST EMBODIMENT OF THE PRESENT INVENTION

An explanation will be given below of a nitride semiconductor light emitting device according to the present invention in reference to the applied drawings.

As an explanatory cross-sectional view of a resonant cavity light emitting diode of an embodiment is shown in FIG. 1, the nitride semiconductor light emitting device according to the present invention is provided with at least a light emitting layer forming portion 3 provided on a first light reflection layer 2 provided on a substrate 1. The first light reflection layer 2 is formed with laminating a low refractivity layer 21 and a high refractivity layer 22 which have a different refractivity from each other, and the low refractivity layer 21 of the first light reflection layer is formed with a single layer structure of an $Al_xGa_{1-x}N$ layer (0≦x≦1), and the high refractivity layer 22 of the first light reflection layer is formed with a multi layer structure formed by laminating alternately an $Al_yGa_{1-y}N$ layer (0≦y≦0.5 and y<x) or an $In_tGa_{1-t}N$ layer (0<t≦0.5) and an $In_uGa_{1-u}N$ layer (0<u≦1 and t<u). In addition, a second light reflection layer 4 is formed on the light emitting layer forming portion 3.

The first light reflection layer 2 is provided on the substrate 1 and acts as a light reflection layer with a high reflection coefficient formed by laminating the low refractivity layer 21 and the high refractivity layer 22 with a thickness of $\lambda/(4n)$ alternately, which have different refractive indices. In the example shown in FIG. 1, on an $Al_{0.2}Ga_{0.8}N$ buffer layer 9 formed on a SiC substrate 1, the first light reflection layer 2 is formed by laminating the low refractivity layer 21 and the high refractivity layer 22 approximately 10 to 50 times (pairs). It is preferable that the buffer layer 9 is made of a nitride semiconductor material represented by a general formula $Al_aGa_bIn_{1-a-b}N$ (0≦a≦1, 0≦b≦1 and 0≦a+b≦1), but is not limited to this. A thickness or the like of the buffer layer can be adjusted depending on functions properly.

The low refractivity layer 21 of the first light reflection layer 2 is formed with a single layer structure of $Al_xGa_{1-x}N$ layer (0<x<1) 21b. The $Al_xGa_{1-x}N$ low refractivity layer 21 is an adjustment layer for lowering a refractive index actually and formed with a thickness of $\lambda/(4n)$. Since the $Al_xGa_{1-x}N$ low refractivity layer 21 absorbs and flattens the V defects occurring in an InGaN based compound included in the high refractivity layer 22 described later, the active layer laminated on the first light reflection layer 2 is also flattened and crystallinity of the active layer is not deteriorated. In the example shown in FIG. 1, the $Al_{0.3}Ga_{0.7}N$ low refractivity layer 21 is formed with a thickness of approximately 460 nm (a wavelength of emitted light is 450 nm).

The high refractivity layer 22 of the first light reflection layer 2 is formed with a multi layer structure of an $Al_yGa_{1-y}N$ layer ($0<y\leq 0.5$ and $y<x$) or an $In_tGa_{1-t}N$ layer ($0\leq t\leq 0.5$) and an $In_uGa_{1-u}N$ layer ($0<u\leq 1$ and $t<u$). The $In_uGa_{1-u}N$ layer ($0<u\leq 1$ and $t<u$) is an adjustment layer 22a for increasing a refractive index actually. On the contrary, the $Al_yGa_{1-y}N$ layer ($0<y\leq 0.5$ and $y<x$) or the $In_tGa_{1-t}N$ layer ($0\leq t\leq 0.5$) is a relaxation layer 22b for relaxing mismatching of lattice constants and coefficients of thermal expansion between the adjustment layer 22a and the $Al_xGa_{1-x}N$ low refractivity layer 21. In such manner, since the high refractivity layer is formed with a multi layer structure, deterioration of crystallinity caused by difference of coefficients of thermal expansion and lattice constants is significantly lowered comparing to a case of not using a multi layer structure.

In addition, the relaxation layer 22b of the light reflection layer 2 is preferably formed with the $Al_yGa_{1-y}N$ layer ($0\leq y\leq 0.5$ and $y<x$), because deterioration of flatness caused by occurrence of V defects can be more inhibited comparing to in a conventional case. Namely, by using the $Al_yGa_{1-y}N$ layer ($0\leq y\leq 0.5$ and $y<x$) not containing In for the relaxation layer 22b, a layer not containing In becomes to exist in the high refractivity layer, a total thickness of an InGaN based compound layer in a high refractivity layer becomes thin comparing to that in a conventional case of the InGaN based compound layer with a single layer structure. Therefore, while inhibiting deterioration of flatness caused by V defects, a semiconductor light emitting device in which deterioration of crystallinity caused by difference of lattice constants and coefficients of thermal expansion is more inhibited.

For example, in the example shown in FIG. 1, the $In_uGa_{1-u}N$ adjustment layer 22a (for example, u=0.02) with a thickness of approximately 0.5 to 2 nm, preferably approximately 1 nm and the $Al_yGa_{1-y}N$ relaxation layer 22b (for example, y=0; namely GaN) with a thickness of approximately 1 to 3 nm, preferably approximately 2 nm are laminated approximately fifteen times (pairs).

Portions except the first light reflection layer 2 constituted as described above can be formed with the same structure as that of a conventional nitride semiconductor light emitting device. However, the example shown in FIG. 1 is an example of a resonant cavity light emitting diode, and the first and second light reflection layers 2 and 4 are provided on both sides of the light emitting layer forming portion 3. Although the silicon carbide (SiC) substrate is used for the substrate 1, this is not to be limited and an insulating substrate such as a sapphire ($Al_2O_3$ single crystal) substrate or the like or a semiconductor substrate made of such as GaN, GaAs, Si, Zno or the like may be used. In case of using the insulating substrate, since an electrode can not be taken out from a back surface of the substrate, it is necessary to expose the conductivity type layer (in FIG. 1, an n-type layer 31 or a contact layer not shown in the figure) underlying by etching and removing a part of the semiconductor lamination portion.

The light emitting layer forming portion 3 has an active layer 32 and formed on the first light reflection layer 2. The light emitting layer forming portion 3 is made of a nitride material represented by a general formula $Al_aGa_bIn_{1-a-b}N$ ($0\leq a\leq 1$, $0\leq b\leq 1$ and $0\leq a+b\leq 1$). In the example shown in FIG. 1, an n-type GaN spacer layer 31 with a thickness of approximately 0.5 μm and a p-type GaN spacer layer 33 with a thickness of approximately 0.5 μm are provided so as to hold the active layer 32. These layers are layers which act for adjusting a film thickness of the light emitting layer forming portion 3 which is a vertical length of a resonant cavity, the resonant cavity is formed between the first and second light reflection layers 2 and 4 by adjusting a total thickness of the light emitting layer forming portion 3 to be λ/n, and light is radiated from a side of the second light reflection layer 4 which is formed with a slightly smaller coefficient of reflection by being amplified in the resonant cavity. In addition, in case of a conventional light emitting diode, the spacer layers 31 and 33 may not be used, an electron barrier layer or a hole barrier layer may be provided in place of the spacer layers 31 and 33, and a composition or a thickness thereof may be adjusted properly. The active layer 32 is formed with a total thickness of approximately 0.01 to 0.1 μm by selecting a material having a band gap energy corresponding to a wavelength of light emitted, and by forming, for example, a bulk structure made of $In_{0.15}Ga_{0.85}N$ with a thickness of approximately 0.01 to 0.2 μm or a single quantum well structure or a multi quantum well layer structure of an $In_{0.1}Ga_{0.9}N$ well layer with a thickness of approximately 1 to 20 nm and a GaN barrier layer with a thickness of approximately 1 to 20 nm. The active layer 32 is formed with undoping, but it may be a p-type layer or an n-type layer.

It is preferable that a resonant cavity is formed by providing the second light reflection layer 4 on the light emitting layer forming portion 3, having a smaller coefficient of reflection than that of the first reflection layer 2, from the view point of enabling to form a device of a type in which light is radiated from an upper surface or from a side. In the example shown in FIG. 1, the second light reflection layer 4 is provided with a low refractivity layer 41 and a high refractivity layer 42 in the same way as the first light reflection layer 2, and constituted with lowering a coefficient of reflection slightly comparing to that of the first light reflection layer 2. Each of the low refractivity layer 41 and the high refractivity layer 42 of the second light reflection layer 4 is preferably formed with a multi layer structure, because a coefficient of reflection of the second light reflection layer 4 can be improved. Namely, since the second light reflection layer 4 is formed after forming the active layer 32, even if V defects occur by an InGaN based compound layer constituting whole or a part of the high refractivity layer, crystallinity of the active layer 32 can not be influenced being different from a case of the first light reflection layer 2, and the low refractivity layer of the second light reflection layer 4 is not required to be formed with a single layer of an AlGaN based compound. Therefore, both of the low refractivity layer 41 and the high refractivity layer 42 can be formed with a multi layer structure and deterioration of the coefficient of reflection can be inhibited.

Figure 2:
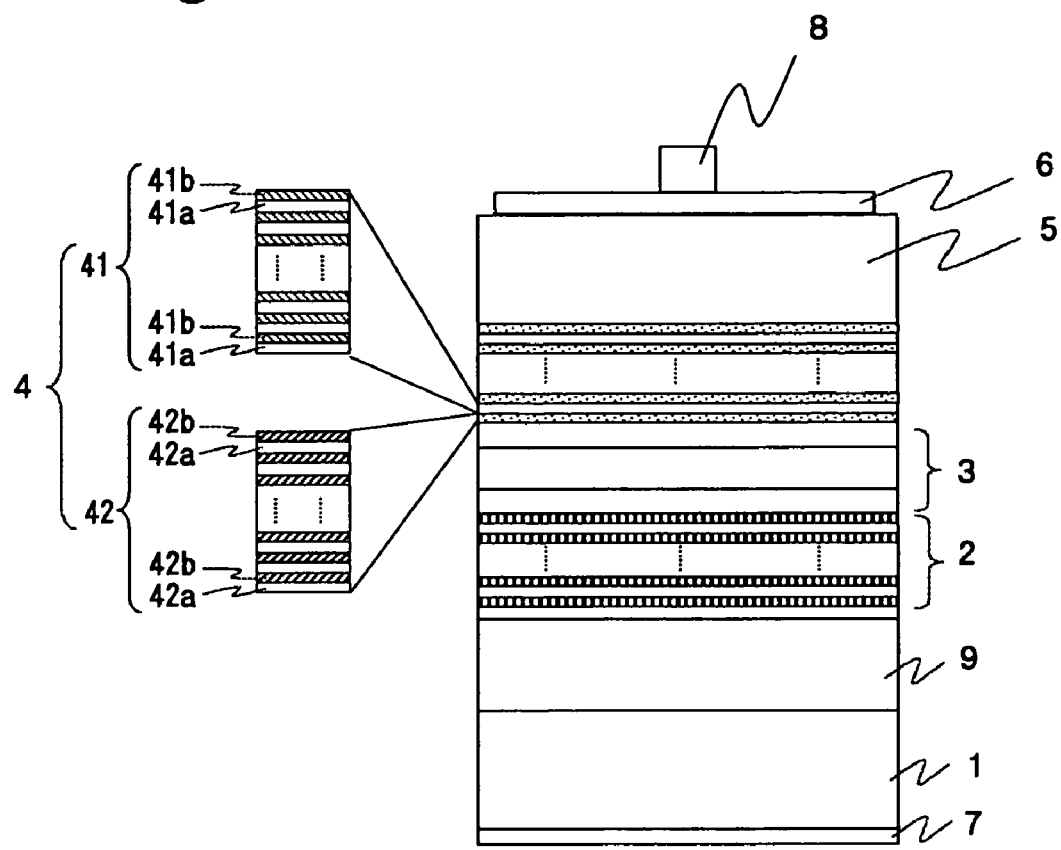
FIG. 2 is an explanatory cross-sectional view of a semiconductor laser which is another embodiment of the present invention.
Figure 3:
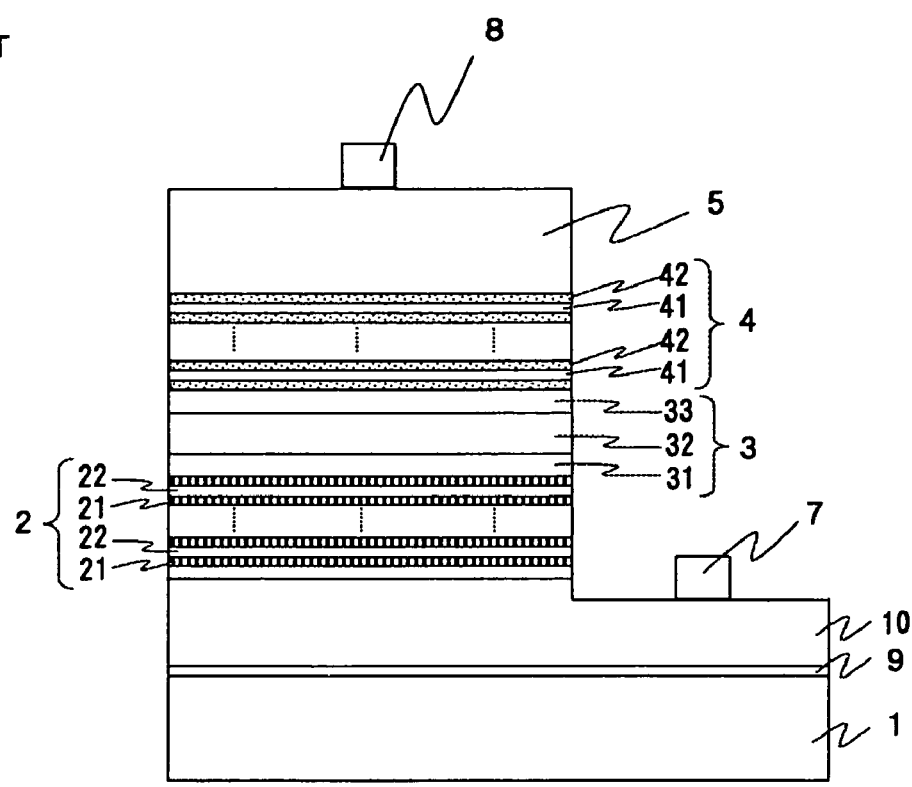
FIG. 3 is an explanatory cross-sectional view explaining a conventional semiconductor laser.

For example, in an example shown in FIG. 2, the high refractivity layer 42 is formed by laminating an adjustment layer 42a made of, for example, an InGaN based compound, concretely, $In_{0.02}Ga_{0.98}N$ with a thickness of approximately 1 nm and a relaxation layer 42b made of GaN with a thickness of 2 nm approximately fifteen times. The low refractivity layer 41 is formed by laminating an adjustment layer 41a made of, for example, an AlGaN based compound, concretely, $Al_{0.3}Ga_{0.7}N$ with a thickness of approximately 1 nm and a GaN relaxation layer 42b with a thickness of 2 nm approximately fifteen times (pairs). In addition, the low refractivity layer 41 and the high refractivity layer 42 are laminated approximately 10 to 50 times (pairs) alternately. Now, a low refractivity layer 41 and a high refractivity layer 42 with a bulk structure can be laminated, or any one of them can be formed with a multi layer structure. Further, a composition or a film thickness of each layer can be varied properly.

A light transmitting conductive layer 6 is provided on the second light reflection layer 4. For example, the light transmitting conductive layer is formed with a material such as a layer with a thickness of 2 to 100 nm which is formed by laminating Ni and Au and alloying them, a ZnO layer, ITO layer or the like which is, while transmitting light, conductive to diffuse electric current to whole surface of a chip, and easy to form an ohmic contact. Since the ZnO or ITO is conductive even when it is thick, it is formed, for example, approximately 0.1 to 2 μm thick. In the example shown in FIG. 1, a ZnO layer with a thickness of approximately 0.3 μm is formed as the light transmitting conductive layer 6. In addition, for example, a p-type GaN contact layer 5 may be provided between the second light reflection layer 4 and the light transmitting conductive layer 6. The contact layer 5 is generally formed with a GaN layer which is easy to increase a carrier concentration, however it may be formed with an InGaN based compound layer or an AlGaN based compound layer.

A second electrode 8 in the example shown in FIG. 1 is formed as a p-side electrode because an upper side of the semiconductor lamination portion is a p-type layer, and formed with a lamination structure of, for example, Ti/Au, Pd/Au, Ni-Au or the like, with a thickness of approximately 0.1 to 1 μm in total, and a first electrode 7 (n-side electrode) in the example shown in FIG. 1 is formed on a back surface of the substrate, with an alloy layer or a lamination structure of Ti-Al, Ti/Au or the like, and with a thickness of approximately 0.1 to 1 μm in total. And, in case of using a sapphire substrate, since an ohmic contact can not be achieved at a back surface of the substrate, an exposed surface is formed on a buffer layer or the like by dry etching or the like such as reactive ion etching under an atmosphere of a mixed gas of, for example, $Cl_2$ and $BCl_3$, or the like, and the first electrode is formed on the exposed surface.

In order to form the above described light emitting layer forming portion, a light reflection layer or the like with n-type conductivity, Se, Si, Ge, or Te is mixed in a reactive gas as an impurity raw gas such as $H_2Se$, $SiH_4$, $GeH_4$, $TeH_4$ or the like. And, in order to form with p-type conductivity, Mg or Zn is mixed in a raw gas as metal organic gas such as $Cp_2Mg$ or DMZn. However in case of forming with n-type conductivity, even if impurity is not mixed, the n-type conductivity is formed spontaneously since N is apt to vaporize during forming layers, then this phenomena may be utilized.

Subsequently, a brief explanation of a method for manufacturing the semiconductor light emitting device according to the present invention will be given below using a concrete example. By setting the SiC substrate 1 within, for example, a MOCVD (metal organic chemical vapor deposition) apparatus, supplying component gas of a semiconductor layer grown such as trimethyl gallium, trimethyl aluminium, trimethyl indium or ammonia gas, any of $H_2Se$, $SiH_4$, $GeH_4$, or $TeH_4$ as n-type dopant gas, and necessary gas of dimethyl zinc or biscyclopentadienyl magnesium as p-type dopant gas, together with $H_2$ gas or $N_2$ gas as carrier gas, and at a temperature of, for example, approximately 700 to 1,200° C., there are formed the n-type $Al_{0.2}Ga_{0.8}N$ buffer layer 9, the high refractivity layer 22 with a thickness of approximately 45 nm which is formed by laminating the adjustment layer 22a made of InGaN based compound with a thickness of approximately 1 nm and the GaN relaxation layer 22b with a thickness of approximately 2 nm alternately fifteen times, and thereafter the $Al_{0.3}Ga_{0.7}N$ low refractivity layer with a thickness of approximately 46 nm. Then, the first light reflection layer is formed by laminating the high refractivity layer and the low refractivity layer alternately twenty times.

Subsequently, the n-type GaN spacer layer 31 with a thickness of 0.5 μm, the quantum well active layer 32 formed by laminating a well layer made of $In_{0.1}Ga_{0.9}N$ and a barrier layer made of GaN approximately five times, and the GaN spacer layer 33 with a thickness of 0.5 μm are formed sequentially, thereby the light emitting layer forming portion 3 is formed. Subsequently, when the second light reflection layer 4 is formed, after growing the p-type GaN spacer layer, the high refractivity layer 42 with a thickness of approximately 46 nm formed by growing the $In_{0.02}Ga_{0.98}N$ adjustment layer 42a and the GaN relaxation layer 42b with a thickness of approximately 2 nm alternately approximately fifteen times, and by laminating the $Al_{0.3}Ga_{0.7}N$ adjustment layer 41a with a thickness of approximately 2 nm and the GaN relaxation layer 42b with a thickness of approximately 1 nm alternately fifteen times, the low refractivity layer is formed with a thickness of approximately 45 nm in total. Then, the low refractivity layer 41 and the high refractivity layer 42 are laminated alternately approximately twenty times. After forming the second light reflection layer, the p-type GaN contact layer 5 with a thickness of 0.05 to 2 μm is epitaxially grown sequentially.

Thereafter, a $SiO_2$ protection film is provided on a whole surface of the contact layer 5 and thereafter annealed at a temperature of approximately 400 to 800° C. for approximately 20 to 60 minutes. Then, a transparent electrode 6 made of ZnO is formed with a thickness of approximately 0.3 μm on the contact layer 5, and further the second electrode 8 is formed by forming a metal film made of Ti, Al or the like by sputtering or vapor deposition. And after the substrate is thinned by lapping a back surface side of the substrate, the first electrode 7 is formed on a back surface of the substrate by forming a metal film made of Ti, Au or the like by sputtering or vapor deposition. Finally, the semiconductor light emitting device is formed by scribing a wafer into chips.

INDUSTRIAL APPLICABILITY

Characteristics of a light emitting device using nitride semiconductor, such as a LED and a laser diode can be improved and the nitride semiconductor light emitting device can be used in every kinds of electronic apparatus using such semiconductor light emitting devices.

What is claimed is:

1. A nitride semiconductor light emitting device comprising:
   a substrate made of SiC;
   a first light reflection layer provided on the substrate, the first light reflection layer being formed by laminating alternately a low refractivity layer and a high refractivity layer which has a higher refractivity than a refractivity of the low refractivity layer; and
   a light emitting layer forming portion provided on the first light reflection layer,
   wherein the low refractivity layer of the first light reflection layer is formed with a single layer structure of an $Al_xGa_{1-x}N$ ($0<x<1$) layer, and the high refractivity layer of the first light reflection layer is formed with a multi layer structure formed by laminating alternately an $Al_yGa_{1-y}N$ ($0\leq y\leq 0.5$ and $y<x$) layer and an $In_uGa_{1-u}N$ ($0<u\leq 1$) layer, wherein one of the low refractivity layers is in contact with one of the high refractivity layers, and the one of the high refractivity layers is in contact with another of the low refractivity layers.

2. The nitride semiconductor light emitting device according to claim 1, wherein a relaxation layer made of the $Al_yGa_{1-y}N$ ($0\leq y\leq 0.5$ and $y<x$) is formed with a thickness of 1 to 3 nm, and an adjustment layer made of the $In_uGa_{1-u}N$ ($0<u\leq 1$) is formed with a thickness of 0.5 to 2 nm.

3. The nitride semiconductor light emitting device according to claim 1, wherein a second light reflection layer formed by laminating alternately a low refractivity layer and a high refractivity layer which has a higher refractivity than a refractivity of the low refractivity layer of the second light reflection layer is further provided at an upper surface side of the light emitting layer forming portion.

4. The nitride semiconductor light emitting device according to claim 3, wherein the light emitting layer forming portion is formed with a lamination structure of an n-type layer, an active layer and a p-type layer so that light emitted in the active layer resonates between the first light reflection layer and the second light reflection layer.

5. The nitride semiconductor light emitting device according to claim 3, wherein a reflection coefficient of the second light reflection layer is smaller than a reflection coefficient of the first light reflection layer, and light is taken out through a second light reflection layer side.

6. The nitride semiconductor light emitting device according to claim 3, wherein at least one of the low refractivity layer and the high refractivity layer of the second light reflection layer is formed with a multi layer structure.

7. The nitride semiconductor light emitting device according to claim 6, wherein the high refractivity layer of the second light reflection layer is formed with a lamination structure of an adjustment layer made of an InGaN based compound and a relaxation layer made of GaN, and the low refractivity layer of the second light reflection layer is formed with a lamination structure of an adjustment layer made of an AlGaN based compound and a relaxation layer made of GaN.

8. The nitride semiconductor light emitting device according to claim 1, wherein each low refractivity layer has a thickness sufficient to reduce an effect of a V defect formed in an adjacent high refractivity layer.

\* \* \* \* \*